(12) United States Patent
Kuroda et al.

(10) Patent No.: US 10,861,684 B2
(45) Date of Patent: Dec. 8, 2020

(54) SPUTTERING TARGET

(71) Applicant: SUMITOMO CHEMICAL COMPANY, LIMITED, Tokyo (JP)

(72) Inventors: Toshiaki Kuroda, Niihama (JP); Mikio Takigawa, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 138 days.

(21) Appl. No.: 15/935,605

(22) Filed: Mar. 26, 2018

(65) Prior Publication Data

US 2018/0286646 A1 Oct. 4, 2018

(30) Foreign Application Priority Data

Mar. 29, 2017 (JP) ................. 2017-064985
Sep. 25, 2017 (JP) ................. 2017-183878

(51) Int. Cl.
| | | |
|---|---|---|
| *H01J 37/34* | (2006.01) | |
| *C23C 14/34* | (2006.01) | |
| *C23C 14/35* | (2006.01) | |
| *C23C 14/14* | (2006.01) | |
| *C23C 14/16* | (2006.01) | |

(52) U.S. Cl.
CPC .......... *H01J 37/3423* (2013.01); *C23C 14/14* (2013.01); *C23C 14/165* (2013.01); *C23C 14/3407* (2013.01); *C23C 14/35* (2013.01); *H01J 37/3405* (2013.01); *H01J 37/3426* (2013.01)

(58) Field of Classification Search
CPC ... C23C 14/14; C23C 14/165; C23C 14/3407; C23C 14/35; H01J 37/3405; H01J 37/3423; H01J 37/3426

USPC ........................... 204/298.12, 198.13
See application file for complete search history.

(56) References Cited

U.S. PATENT DOCUMENTS

| | | |
|---|---|---|
| 6,497,797 B1 | 12/2002 | Kim |
| 9,611,537 B2 | 4/2017 | Kadlec et al. |
| 2003/0075437 A1 | 4/2003 | Marx et al. |
| 2003/0183506 A1 | 10/2003 | Ivanov et al. |
| 2011/0031109 A1 | 2/2011 | Lee et al. |
| 2011/0203920 A1 | 8/2011 | Kadlec et al. |
| 2015/0357169 A1* | 12/2015 | Yuan ............ B23K 35/24 204/298.13 |
| 2016/0343551 A1 | 11/2016 | Takigawa et al. |

FOREIGN PATENT DOCUMENTS

| | | |
|---|---|---|
| EP | 1087033 A1 | 3/2001 |
| JP | 2008-38229 A | 2/2008 |

OTHER PUBLICATIONS

Japanese Notice of Reasons for Refusal for Japanese Application No. 2017-183878, dated Nov. 7, 2017, with English translation.
Japanese Rejection Decision for Japanese Application No. 2017-246815, dated Jun. 12, 2018, with English translation.

* cited by examiner

*Primary Examiner* — Rodney G McDonald
(74) *Attorney, Agent, or Firm* — Birch, Stewart, Kolasch & Birch, LLP

(57) ABSTRACT

A sputtering target comprising a target material, wherein a sputtering face of the target material has a ramp provided to reduce a thickness of the target material at a position where erosion concentrates most intensively during sputtering.

5 Claims, 14 Drawing Sheets

TARGET MATERIAL

TARGET MATERIAL

EROSION

EROSION

PRIOR ART

SPUTTERING TARGET

TECHNICAL FIELD

The present invention relates to a sputtering target.

BACKGROUND ART

Sputtering is a process in which an inert gas such as argon is introduced under vacuum and a high voltage is applied between a substrate and a target material to thereby collide the inert gas being plasmatized (or being ionized) with the target material and to sputter target atoms included in the target material, leading to deposition of the sputtered atoms on the substrate to form a thin film on the substrate.

For example, there has generally been known magnetron sputtering in which a magnet is arranged on the back side of a sputtering face of the target material (i.e., face of a side where the inert gas made into plasma (or being ionized) is brought into collision in the target material), thereby enhancing a deposition rate.

A sputtering target used in such sputtering typically has a plate shape, a cylindrical shape, or a disc shape. Particularly for semiconductor applications, a disc-shaped target material with a flat surface is frequently used, and the sputtering face thereof generally has a circular shape.

JP 4213030 B, JP 2001-140063A, JP4209198B, U.S. Pat. No. 6,497,797B, JP 5676429B and WO 2015/111576 disclose a sputtering target including target materials each having a different surface shape.

SUMMARY OF THE INVENTION

When the thickness of a target material is increased for prolonging life (achieving long life) of a sputtering target, a distance between the target material and a substrate (TS distance) decreases, leading to degradation of film thickness distribution of a thin film to be formed on the substrate, which raises a problem of significant degradation of film thickness uniformity at an initial stage of sputtering. During sputtering, erosion tends to concentrate intensively in a part with a high horizontal magnetic field strength in the target material. In this part, the target material is significantly consumed and a film thickness increases compared with an average film thickness in a middle part of the substrate on which the thin film is to be formed (a region between an end part and a center of the substrate), while the film thickness decreases in the end part of the substrate, causing a problem of significant degradation of the film thickness uniformity, particularly at a final stage of sputtering (FIG. 9 (left)).

Thus, it is an object of the present invention to provide a sputtering target that can improve the film thickness uniformity of a thin film to be formed on a substrate during sputtering, particularly at the final stage of sputtering.

In light of the above-mentioned problems, the inventors have intensively found that the film thickness uniformity of a thin film to be formed on a substrate can be improved during sputtering, particularly at a final stage of sputtering, by providing a ramp at a position where erosion intensively concentrates during sputtering to reduce a thickness of a target material. Thus, the present invention has been completed.

The present application provides an invention as follow:

[1] A sputtering target comprising a target material, wherein a sputtering face of the target material has a ramp provided to reduce a thickness of the target material at a position where erosion concentrates most intensively during sputtering.

[2] The sputtering target according to [1], wherein the position where the erosion concentrates most intensively is a part with a maximum horizontal magnetic field strength during sputtering.

[3] The sputtering target according to [1] or [2], wherein the sputtering face has a circular shape, and the ramp is formed at a position in a range of 60% or more and less than 90% of a diameter of the sputtering face so as to reduce the thickness of the target material toward a peripheral part of the sputtering face in the radical direction of the sputtering face.

[4] The sputtering target according to [3], wherein the target material includes a flat circular first region positioned at a center of the sputtering face, a flat ring-shaped second region positioned around the first region, and a flat ring-shaped third region positioned around the second region, wherein the ramp exists between the second region and the third region, and a thickness of the third region is smaller than a thickness of the second region;

wherein the thickness of the third region is equal to or larger than a thickness of the first region and a diameter of the first region accounts for 14% or more and less than 60% of the diameter of the sputtering face; and wherein an inner diameter of the third region accounts for less than 90% of the diameter of the sputtering face.

[5] The sputtering target according to [4], wherein a ratio of the thickness of the third region to a ring width of the third region is in a range of 0.1 to 1.1.

[6] The sputtering target according to [5], wherein the ratio is in a range of 0.1 to 0.6.

[7] The sputtering target according to [1], wherein the sputtering face has a circular shape, and the ramp is formed at a position in a range of 14% or more and less than 60% of a diameter of the sputtering face so as to reduce the thickness of the target material toward an inner part of the sputtering face in the radial direction of the sputtering face.

According to an aspect of the present invention, the film thickness uniformity can be improved in a thin film to be formed on a substrate during sputtering, particularly at a final stage of sputtering.

MODE FOR CARRYING OUT THE INVENTION

A sputtering target of the present invention comprises a target material, a sputtering face of the target material having at least one ramp provided to reduce a thickness of the target material at a position where erosion intensively concentrates during sputtering.

In the sputtering target of the present invention, the sputtering face has a circular shape, and the ramp is formed at a position in a range of 14% or more and less than 60% of a diameter of the sputtering face so as to reduce the thickness of the target material toward an inner part of the sputtering face in the radial direction of the sputtering face.

In the present invention, the "position where erosion intensively concentrates" means a position where erosion concentrates deeply, preferably a position where erosion concentrates most deeply, in other words, a part with a high horizontal magnetic field strength during sputtering, desirably a part with a maximum or maximal horizontal magnetic field strength on the sputtering face, and more preferably a part with a maximum horizontal magnetic field strength on the sputtering face. At this time, the vertical magnetic field strength at a position where erosion intensively concentrates (magnitude of a component of magnetic field vertical to the sputtering face) is desirably zero (0).

For example, in a sputtering apparatus using a magnet such as an electromagnet, an electrical control that periodically controls electrical current changes a region where a magnetic field is generated every several seconds with the elapse of time. In the part with a high horizontal magnetic field strength on the sputtering face, an inert gas being plasmatized (or being ionized) is captured by a horizontal component of the magnetic field, and erosion of the target material can concentrate intensively at the position.

Figure 19:
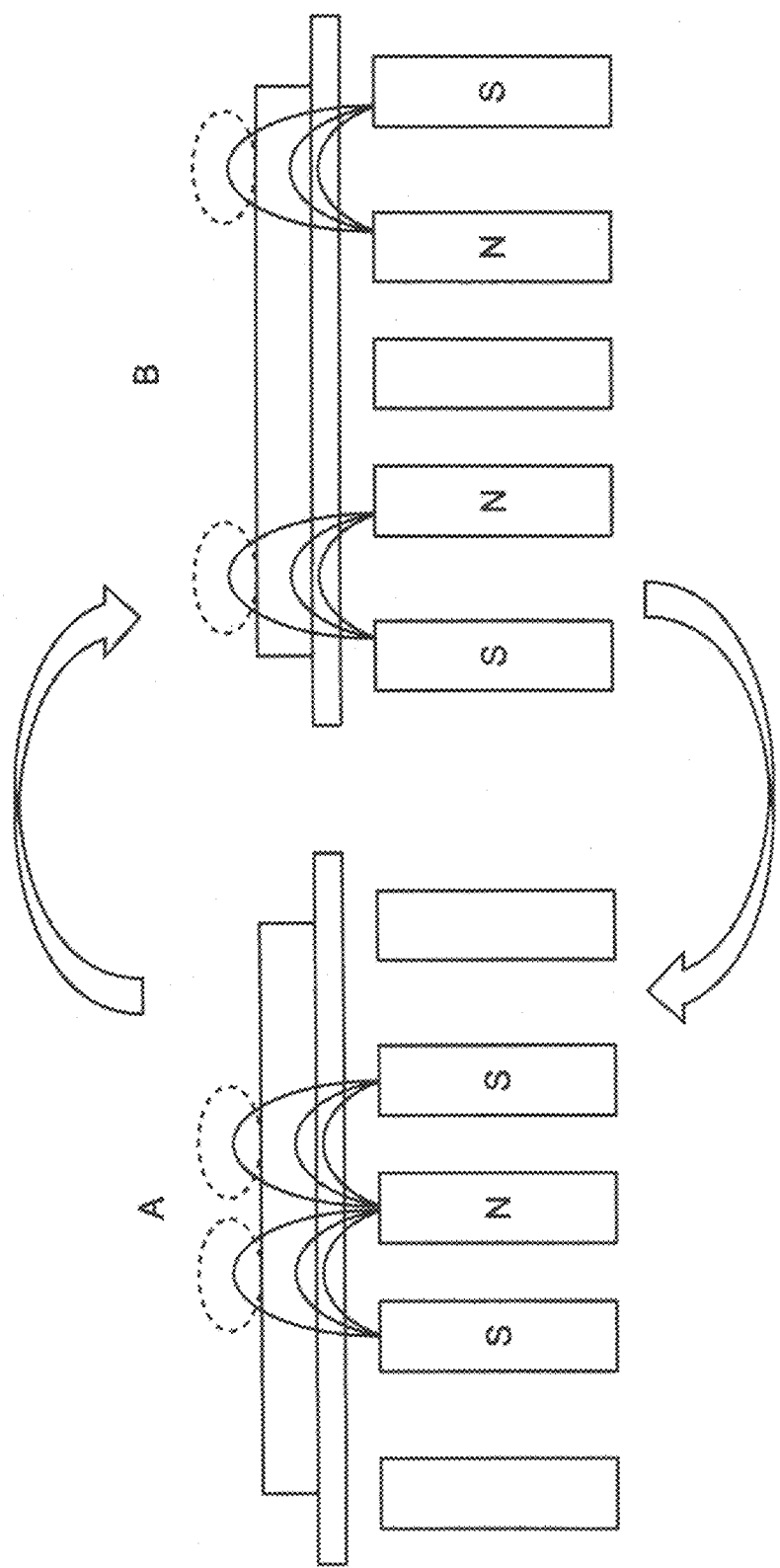
FIG. 19 is a schematic view schematically illustrating a mechanism for forming parts with a high horizontal magnetic field strength (parts encircled by a dotted line).

More specifically, as shown in FIG. 19, regions where magnetic field is generated change with the elapse of time, and parts with a high horizontal magnetic field strength (more specifically, parts encircled by a dotted line in FIG. 19) can be formed on the sputtering face by electrically periodically switching positions of N poles and S poles of a plurality of electromagnets (e.g., by switching between a case A and a case B).

As used herein, the magnetic field is generally indicated by physical quantity having dimension and orientation at every point in space (vector field), so that the "horizontal magnetic field" in the present invention means the magnitude of a component of the magnetic field that is horizontal to the sputtering face and, for example, can be represented as "magnetic flux density" that can be measured by a tesla meter, or the like.

There is a direct proportional relationship between "magnetic flux density" (B) (unit: T (tesla)) and "magnetic field strength" (H) (unit: A/m) as shown by the following equation, so that the "horizontal magnetic field strength" can be determined by measuring the "magnetic flux density" on the sputtering face.

$B=\mu H$ [where μ as a proportional constant represents magnetic permeability]

Therefore, erosion tends to intensively concentrate in a part with a high value of "magnetic flux density" on the sputtering face, desirably a part where a value of magnetic flux density is the maximum value or the maximal value. By providing at least one ramp at the position to reduce a thickness of a target material, the film thickness uniformity can be improved in a thin film that can be formed on a substrate during sputtering, particularly at the final stage of sputtering.

During sputtering, the magnetic flux density in the part with a high horizontal magnetic field strength on the sputtering face (desirably, maximum value or maximal value thereof) is preferably 10 mT to 45 mT, more preferably 20 mT to 40 mT, and particularly preferably 25 mT to 35 mT.

Figure 20:
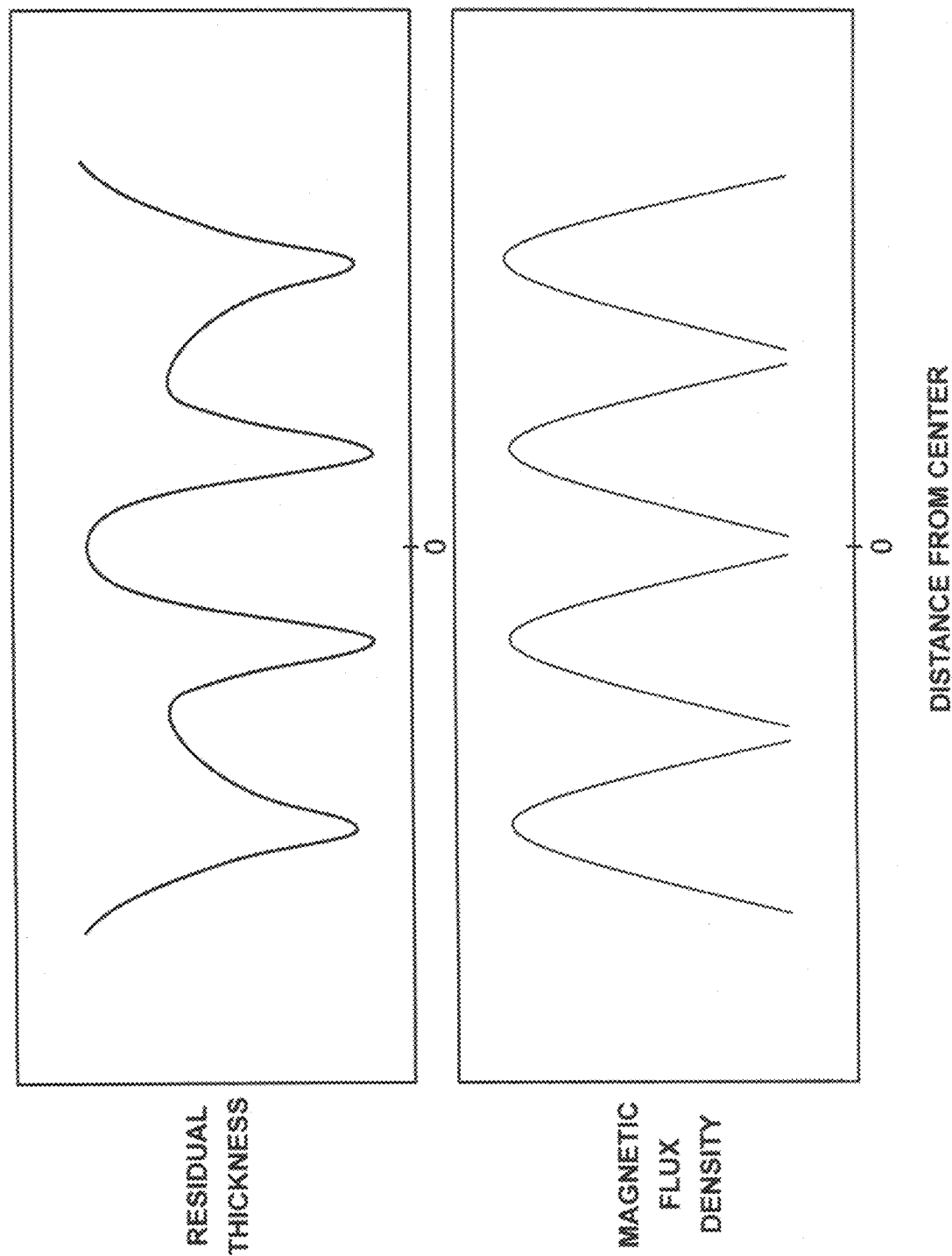
FIG. 20 is a schematic view schematically illustrating a corresponding relation between a magnetic flux density and a residual thickness of a target material subjected to sputtering.

In FIG. 20, a relationship between the magnetic flux density and a residual thickness (erosion amount) of the target material subjected to sputtering is schematically illustrated by a schematic view. FIG. 20 shows that erosion tends to intensively concentrate at a position where a value of magnetic flux density becomes the maximal value.

Figure 1:
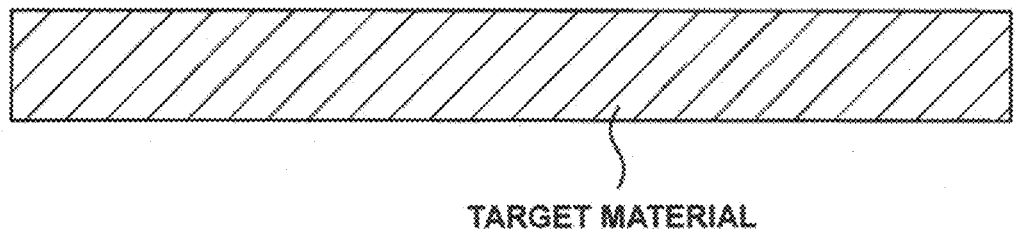
FIG. 1 is a cross-sectional view schematically illustrating a state of a target material of a conventional sputtering target before use.
Figure 2:
FIG. 2 is a cross-sectional view schematically illustrating a state of a target material of a conventional sputtering target after use.

As shown in FIG. 2, the "position where erosion intensively concentrates" can exist near an outer peripheral part in the radial direction of the target material in a conventional disc shaped sputtering target having a circular sputtering face. In the present invention, the "position where erosion intensively concentrates" is not limited to such a position. A plurality of "positions where erosion intensively concentrates" may exist.

The "position where erosion intensively concentrates" can include not only a bottom point of each erosion recess but also a surrounding region including the bottom point as shown in FIG. 2. Specifically, the surrounding region may be in a range of 0.5 mm to 5.0 mm around the bottom point as a center of the erosion recess. Alternatively, the surrounding region may be a region, around the bottom point as a center, where erosion of 80% or more of the erosion of the bottom point is generated.

Figure 5:
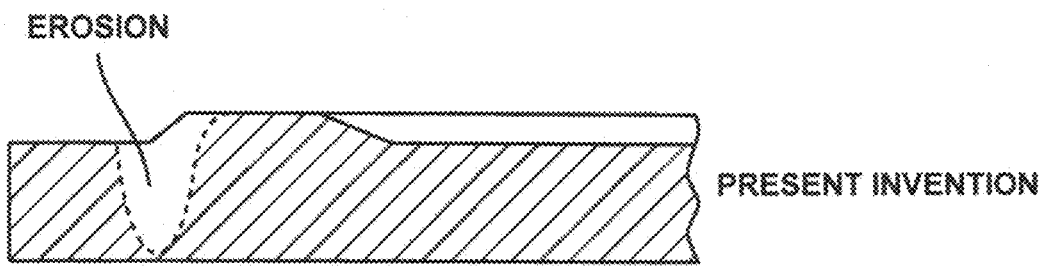
FIG. 5 is a cross-sectional view schematically illustrating a position where erosion intensively concentrates in a target material of a sputtering target of the present invention.

When the sputtering face of the target material has a circular shape, a ramp is provided so as to reduce a thickness of the target material toward an outer side part of the sputtering face in the radial direction of the sputtering face as shown in FIG. 5, (for convenience of explanation, other erosion parts are not shown in FIG. 5), for example, in a range of 60% (lower limit) or more, preferably 65% or more, more preferably 70% or more of the diameter of the sputtering face, and less than 90% (upper limit), more preferably less than 85%, and still more preferably less than 80% of the diameter of the sputtering face.

Figure 3:
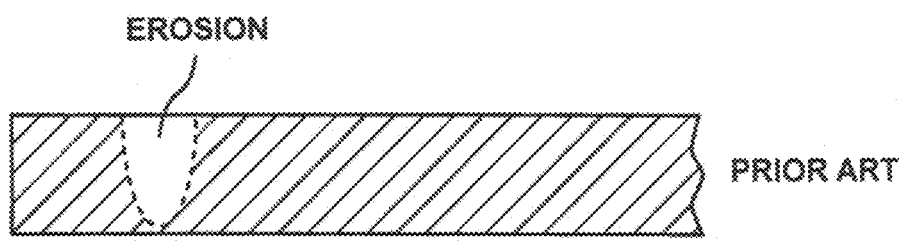
FIG. 3 is a cross-sectional view schematically illustrating a position where erosion intensively concentrates in a target material of a conventional sputtering target.
Figure 4:
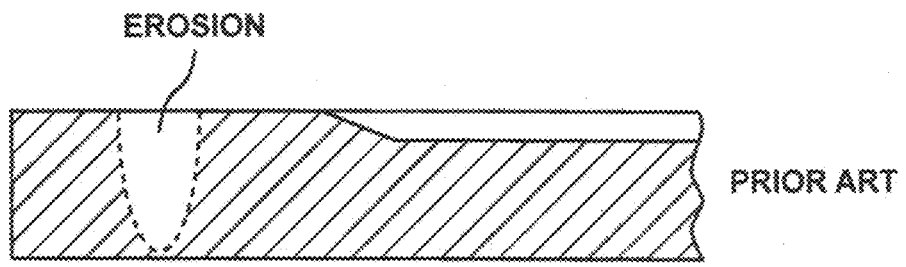
FIG. 4 is a cross-sectional view schematically illustrating a position where erosion intensively concentrates in a target material of a conventional sputtering target.

Conventionally, for example, as shown in FIGS. 3 and 4, a thickness of target material has been increased at a position where erosion intensively concentrates in the aim of achieving prolongation of a life of sputtering target. As shown in FIG. 4, however, as the thickness of the target material increases, the distance between the target material and the substrate (TS distance) becomes smaller. As a result, the film thickness uniformity of thin film to be formed on the substrate at the initial stage of sputtering is significantly degraded (in FIGS. 3 and 4, for convenience of explanation, other erosion parts are not shown). As a result of the study of the present inventors, it has been found that sufficient film thickness uniformity cannot be obtained at the final stage of sputtering by the prior art.

Figure 6:
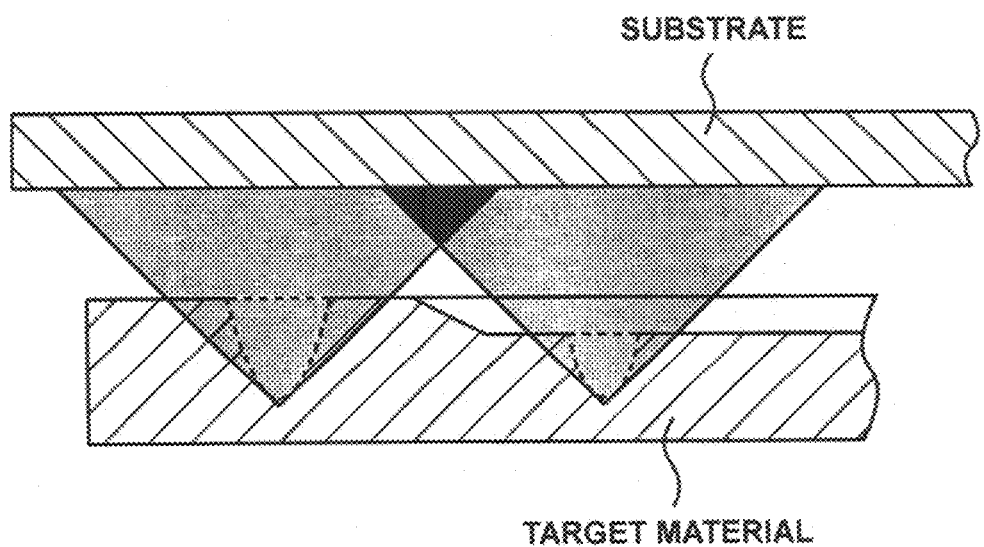
FIG. 6 is a cross-sectional view schematically illustrating deposition of atoms onto a substrate by a target material of a conventional sputtering target.
Figure 9:
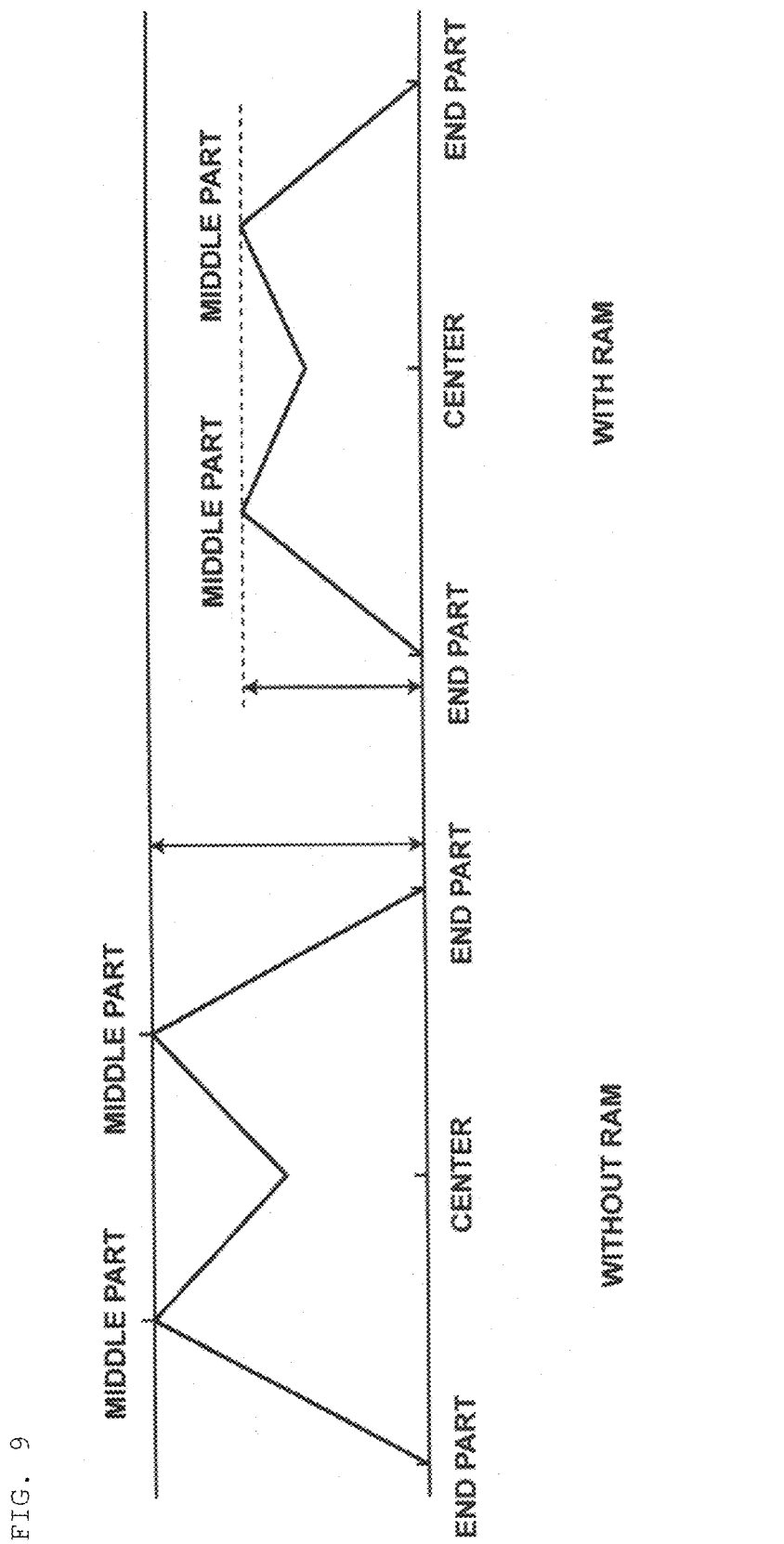
FIG. 9 is a schematic view illustrating a difference in film thickness uniformity in the case of "without a ramp" and a case of "with a ramp".

As it is schematically illustrated in FIG. 6, when the thickness of the target material is increased at a position where erosion intensively concentrates in the target material conventionally for the sake of life prolongation, atoms tend to be intensively deposited in the middle part of the substrate, particularly at the final stage of sputtering. Therefore, the thickness increases in the middle part of the substrate and, in proportion thereto, the thickness decreases in the end part of the substrate. As a result, as shown in FIG. 9 (left), a large difference in thickness of a thin film to be formed is generated among the middle part, the end part, and the center of the substrate, leading to degradation of the film thickness uniformity.

Figure 7:
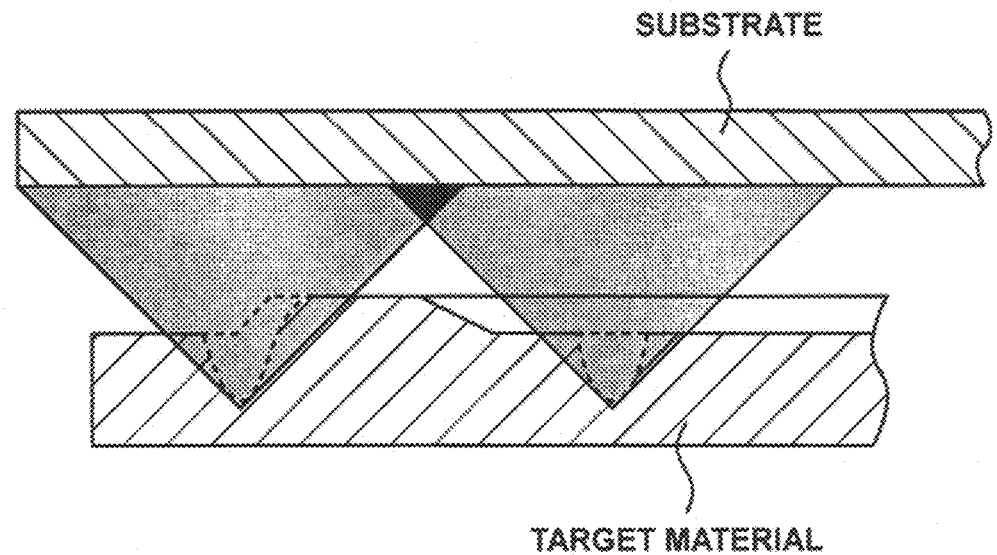
FIG. 7 is a cross-sectional view schematically illustrating deposition of atoms onto a substrate by a target material of a sputtering target of the present invention.
Figure 8:
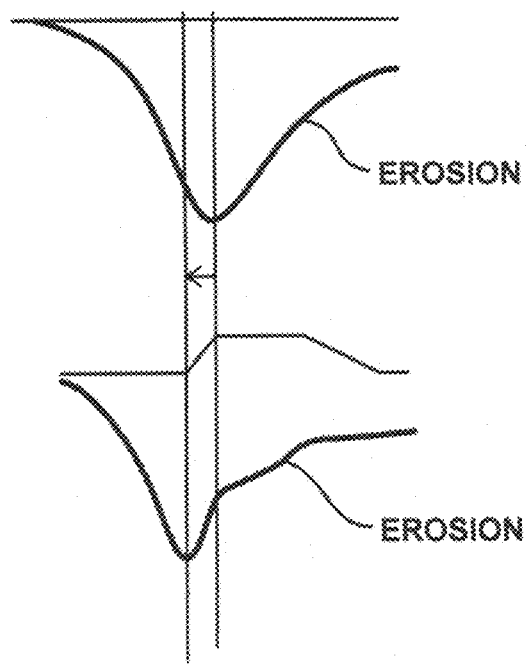
FIG. 8 is a schematic view illustrating shifting of erosion caused by a ramp.

Whereas, in the present invention, as shown in FIG. 7, the sputtering face can be positioned closer to a apparatus (magnetic field) by providing the above ramp to decrease the thickness of target material. In such a ramp part, horizontal magnetic field strength can be further increased. As a result, erosion can start from such a ramp part, and an erosion region can move (shift) to an edge side of the target material (FIG. 8). Atoms can fly preferentially from such a position and shift toward the end parts of the substrate, thus enabling deposition of the atoms. Accordingly, intensive deposition of atoms can be avoided in the middle part of the substrate during sputtering, particularly at the final stage of sputtering, thus making it possible to suppress an increase in thickness thereof. As the erosion region moves to the edge side, an erosion amount generated in a region from the middle part to the center of the sputtering face increases, leading to an increase in the amount of atom flying from the vicinity of the center of the target material. As a result, a difference in thickness generated in the middle part, the end part, and the center decreases, thus making it possible to improve the film thickness uniformity at the final stage of sputtering (FIG. 9 (right)).

Figure 10:
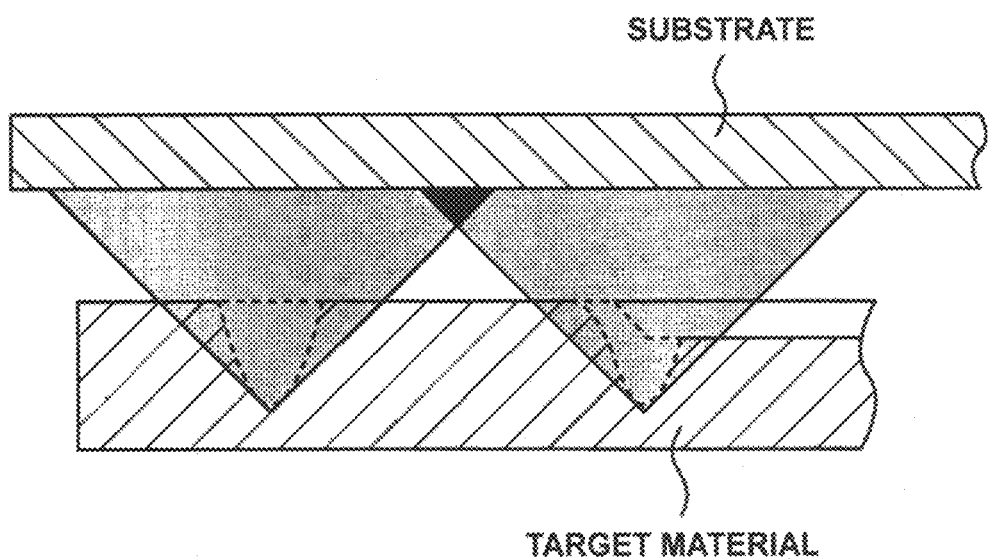
FIG. 10 is a cross-sectional view schematically illustrating deposition of atoms onto a substrate by a target material of another sputtering target of the present invention.

According to the same principle, when the ramp is provided near the center of the sputtering face, deposition of atoms can be moved (shifted) toward the center of the substrate. As a result, similarly, intensive deposition of atoms in the middle part of the substrate can be avoided (FIG. 10). In the present invention, the ramp is formed at a position in a range of 14% or more (lower limit), preferably 20% or more, more preferably 30% or more of the diameter of the sputtering face and less than 60% (upper limit), preferably 58% or less, more preferably 50% or less, and still more preferably 40% or less of the diameter of the sputtering face, to reduce the thickness of the target material toward an inner part of the sputtering face in the radial direction of the sputtering face.

In the present invention, by providing such a ramp on the sputtering face, sufficient film thickness uniformity can be obtained at both the initial stage and the final stage of sputtering, particularly at the final stage.

In the present invention, the initial stage of sputtering (or the initial stage of use of the sputtering target or the target material) means a time when power is consumed at the integral power consumption of, for example 200 kWh or less, preferably 100 kWh or less, and more preferably 50 kWh or less.

In the present invention, the final stage (or the final stage of use of the sputtering target or the target material) of sputtering means a time when power is consumed, for example, at the integral power consumption of preferably 650 kWh or more, more preferably 700 kWh or more, and still more preferably 750 kWh or more.

There is no particular limitation on depth (height) of ramp. The lower limit of the height is, for example, more than 0 mm, preferably 0.2 mm or more, and more preferably 0.5 mm or more, and the upper limit of the height is, for example, 10 mm or less, preferably 5 mm or less, and more preferably 3 mm or less.

The present invention will be described in detail with reference to the following embodiments, but the present invention is not limited to the following embodiments.

EMBODIMENTS

Figure 11:
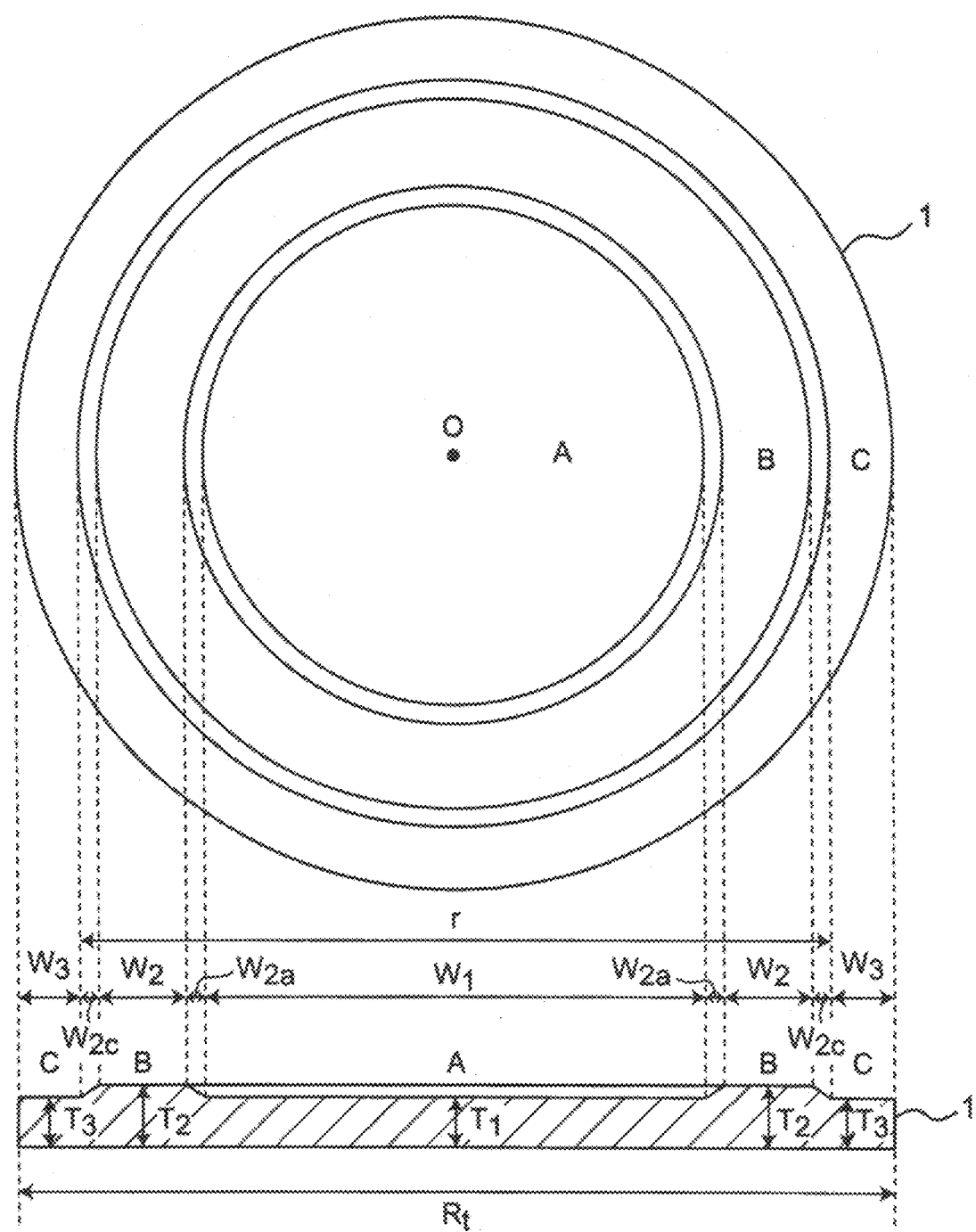
FIG. 11 is a schematic view illustrating a target material of a sputtering target of an embodiment of the present invention.

The sputtering target of the present invention, as shown in FIG. 11, includes a target material 1 whose sputtering face has a circular shape (including approximately circular shape). In the present invention, the sputtering face has a circular shape, but the shape of the entire target material is not particularly limited.

In the embodiment shown in FIG. 11, the target material 1 includes a flat circular (including approximately circular) first region A positioned at a center part of the sputtering face thereof, a flat ring-shaped second region B positioned around the first region, and a flat ring-shaped third region C positioned around the second region.

In the present invention, the "sputtering face" means a surface of the target material that is subjected to sputtering, and the center part of the sputtering face means a part including a geometrical center of the sputtering face (e.g., a part including a center O of a circle in the shown embodiment).

In the present invention, the "flat" means that no projection or recess is substantially formed. Here, the "no projection or recess is substantially formed" means that the projections and the recesses are not formed intentionally. Herein, surface roughness to the extent of about arithmetic average roughness of Ra=7 μm is permittable.

In the present invention, the "ring-shaped" region means, as shown in FIG. 11, a band-shaped region extending concentrically (including approximately concentrically) with an approximately fixed width (hereinafter referred to as "ring width").

The target material has a ramp provided to reduce the thickness of the target material, as mentioned above, at a position where erosion intensively concentrates, preferably, at a position where erosion concentrates most intensively, during sputtering. In the embodiment shown in FIG. 11, there is a ramp between the second region B and the third region C, which will be described in detail below, in the target material 1, and a thickness ($T_3$) of the third region C is smaller than a thickness ($T_2$) of the second region B. The thickness ($T_3$) of the third region C is a thickness ($T_1$) or more of the first region A, which will be described in detail below.

In the embodiment shown in FIG. 11, in the target material 1, a diameter ($W_1$) of the first region A is 14% or more, preferably 20% or more, more preferably 30% or more, still more preferably 31% or more, yet more preferably 32% or more, and most preferably 35% or more of a diameter ($R_t$) of the sputtering face, and is less than 60%, preferably less than 50%, and more preferably less than 40% of the diameter ($R_t$) of the sputtering face. When the diameter is in the above range, satisfactory film thickness uniformity can be obtained at the initial stage and the final stage, particularly at the final stage, of sputtering while achieving life prolongation of the sputtering target.

An inner diameter (r) of the third region C is less than 90%, preferably 89% or less, more preferably 85% or less, still more preferably 80% or less, yet more preferably 75% or less, and further preferably 71% or less or 70% or less of the diameter ($R_t$) of the sputtering face, and is 60% or more, and more preferably 65% or more of the diameter ($R_t$) of the sputtering face. When the inner diameter is in this range, a ramp can be arranged at a position where erosion intensively concentrates, and thus satisfactory film thickness uniformity can be obtained at the initial stage and the final stage, particularly at the final stage, of sputtering while achieving the life prolongation of the sputtering target. Besides, intensive deposition can be suppressed in the center and the middle part, particularly in the middle part, of a thin film that can be formed on the substrate. As a result, a difference in thickness between the middle part and the end part can be decreased, thus making it possible to obtain uniform and excellent film thickness distribution over the entire area of the substrate.

A ratio ($T_3/W_3$) of the thickness ($T_3$) of the third region C to a ring width ($W_3$) of the third region C is in a range of, for example, 0.1 or more, preferably 0.2 or more, and more preferably 0.3 or more, and is 1.1 or less, preferably 0.6 or less, and more preferably 0.5 or less. When the ratio is in this range, the position of the ramp can be adjusted more appropriately, and thus satisfactory film thickness uniformity can be obtained at the initial stage and the final stage, particularly at the final stage, of sputtering while achieving life prolongation of the sputtering target.

The target material will be described in detail below.
Target Material

The target material can be made of a material selected from the group consisting of, for example, metals such as aluminum (Al), chromium (Cr), iron (Fe), tantalum (Ta), titanium (Ti), zirconium (Zr), tungsten (W), molybdenum (Mo), and niobium (Nb), and alloys thereof. Materials constituting the target material are not limited thereto.

The material of the target material is preferably aluminum, and it is particularly preferred to use aluminum having a purity of, for example, 99.99% or more, and more preferably 99.999% or more.

The material of the target material is also preferably an aluminum alloy. Such an aluminum alloy may contain metals, such as copper and silicon, and the content thereof is, for example, 2% by weight or less, and preferably 1% by weight or less.

In the embodiment shown in FIG. 11, the target material has a sputtering face including a first region A, a second region B, and a third region C.

In FIG. 11, the diameter ($R_t$) of the sputtering face is, for example, in a range of 260 mm to 325 mm.

Preferably, a reverse face (surface opposite to the sputtering face) of the target material has a circular outer periphery. The reverse face has a diameter from the center to outer periphery in a range, for example, of 260 mm to 440 mm.
First Region A In the embodiment shown in FIG. 11, the first region A is a flat and circular region positioned in the center of the sputtering face.

The diameter ($W_1$) of the first region A is, for example, 10 mm to 180 mm, preferably 20 mm to 160 mm, and more preferably 30 mm to 130 mm.

The thickness ($T_1$) of the first region A is, for example, 10 mm to 35 mm, preferably 11 mm to 30 mm, and more preferably 12 mm to 25 mm.

The first region A makes it possible to obtain such an effect that intensive deposition of a film onto the center and the middle part of the substrate during sputtering can be suppressed.
Second Region B In the embodiment shown in FIG. 11, the second region is a flat ring-shaped region that can be arranged apart from or adjacent to the circumference of the first region.

The ring width ($W_2$) of the second region B is, for example, 5 mm to 75 mm, preferably 10 mm to 50 mm, and more preferably 20 mm to 30 mm.

The thickness ($T_2$) of the second region B is, for example, 5 mm to 40 mm, preferably 10 mm to 30 mm, and more preferably 12 mm to 25 mm.

The second region B can increase a deposition amount of a film onto the outer peripheral part at the middle part and the center of the substrate during sputtering.

There is no particular limitation on distance ($W_{2a}$) between the inner circumference of the second region B and the outer periphery of the first region A (width of an inside ramp part) The distance is, for example, 0 mm to 60 mm, preferably 5 mm to 40 mm, and more preferably 10 mm to 30 mm.

The thickness ($T_2$) of the second region B is larger than the thickness ($T_1$) of the first region A, and a difference thereof is, for example, 0.5 mm to 10 mm, preferably 1 mm to 5 mm, and more preferably 1.5 mm to 4 mm. Providing a ramp can suppress intensive deposition of a film onto the middle part of the substrate during sputtering.

Preferably, the thickness ($T_2$) of the second region B is equivalent to the thickness of the target material of the conventional standard sputtering target.

The sputtering face of the target material 1 includes a recessed face composed of the first region A and may further include a recessed face composed of the third region C, which will be described in detail below. These recessed faces will be formed lower than the conventional sputtering face. The recessed faces exist at positions where erosion intensively concentrates, so that the distance between the target material and the substrate (TS distance) will not be reduced in comparison with a conventional one. Therefore, the sputtering material in the present invention can have improved film thickness uniformity of a thin film that can be formed on the substrate at the initial stage and the final stage of sputtering. Surprisingly, the thickness ($T_2$) of the second region B is equivalent to the thickness of a conventional target material but life prolongation of the sputtering target can be achieved.

Third Region C

In the present invention, the sputtering material may include the third region C. In the embodiment shown in FIG. 11, the third region is a flat ring-shaped region that can be arranged apart from or adjacent to the circumference of the second region.

The ring width ($W_3$) of the third region C is, for example, 1 mm to 100 mm, preferably 20 mm to 80 mm, and more preferably 30 mm to 60 mm.

The thickness ($T_3$) of the third region C is, for example, 7 mm to 30 mm, preferably 10 mm to 27 mm, and more preferably 12 mm to 25 mm.

The third region C can provide the improved film thickness uniformity of a thin film that can be formed on the substrate at the initial stage and the final stage, particularly at the final stage, of sputtering.

There is no particular limitation on distance ($W_{2c}$) between the inner circumference of the third region C and the outer periphery of the second region B (width of the outside ramp part). For example, the distance is 0 mm to 20 mm, preferably 1 mm to 10 mm, and more preferably 2 mm to 6 mm.

The thickness ($T_3$) of the third region C is smaller than the thickness ($T_2$) of the second region B, and a difference thereof is, for example, 0.3 mm to 10 mm, preferably 0.5 mm to 6 mm, and more preferably 1 mm to 3 mm. As mentioned above, such a ramp is provided at a position where erosion intensively concentrates (or a position where erosion intensively concentrates can be formed by the ramp), giving both life prolongation of the sputtering target and improvement in film thickness uniformity at the initial stage and the final stage, particularly at the final stage, of sputtering.

The thickness ($T_3$) of the third region C is equal to or larger than the thickness ($T_1$) of the first region A, and a difference thereof is, for example, 0 mm to 10 mm, preferably 0.5 mm to 8 mm, and more preferably 1 mm to 6 mm. This difference in height can increase a deposition amount of a film onto the outer periphery part of the substrate with respect to the center of the substrate during sputtering.

Fourth Region D

Figure 15:
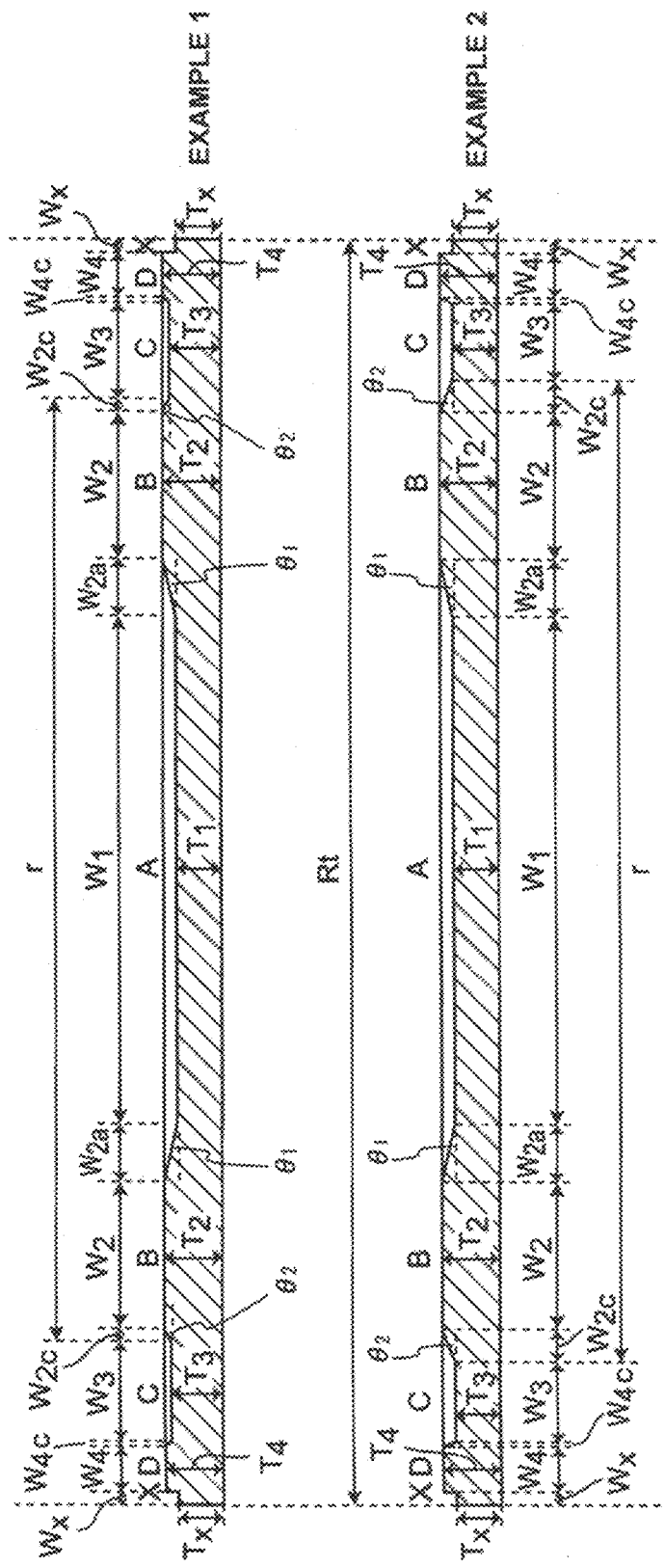
FIG. 15 is a schematic view illustrating a cross section of a target material of a sputtering target to be used in Examples of the present invention.
Figure 16:
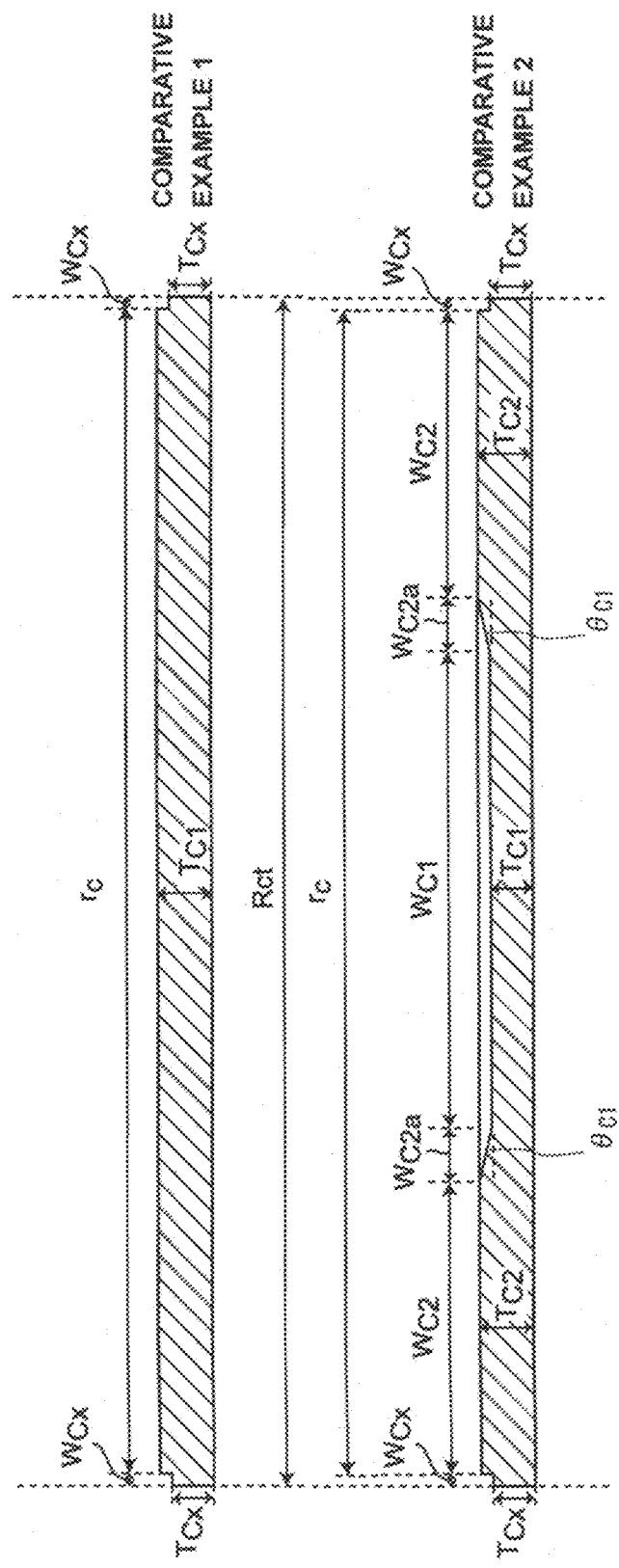
FIG. 16 is a schematic view illustrating a cross section of a target material of a sputtering target to be used in Comparative Examples.

The present invention may further include a fourth region D outside the third region C (for example, see, FIG. 15).

A ring width ($W_4$) of the fourth region D is, for example, of 1 mm to 30 mm, preferably 3 mm to 20 mm, and more preferably 5 mm to 15 mm.

The thickness ($T_4$) of the fourth region D is the same as the thickness ($T_2$) or less than the thickness ($T_2$), for example, 5 mm to 40 mm, preferably 10 mm to 30 mm, and more preferably 12 mm to 25 mm.

There is no particular limitation on distance ($W_4c$) between an inner circumference of the fourth region D and the outer periphery of the third region C (width of the ramp portion). The distance is, for example, 0 mm to 30 mm, preferably 0.1 mm to 10 mm, and more preferably 0.2 mm to 5 mm.

The fourth region D can provide a space to mount a jig (contamination plate) for covering the target material so as prevent re-sticking thereto the sputter particles which generated during sputtering but did not reach the substrate. In other words, the fourth region D can control abnormal discharge due to excessive deposition caused by the re-sticking.

Region X

The present invention may further include a region X outside the fourth region D (for example, see, FIG. 15). The region X is a ramp that can be formed on a side surface of the target material. Neither the region X nor the ramp inside the region D falls within the scope of "ramp" between the above second region B and third region C.

A ring width ($W_x$) of the region X is, for example, 1 mm to 10 mm, preferably 2 mm to 7 mm, and more preferably 3 mm to 5 mm.

A thickness ($T_x$) of the region X is, for example, 8 mm to 32 mm, preferably 10 mm to 30 mm, and more preferably 12 mm to 25 mm. The region X can eliminate clearance with the contamination plate, suppressing abnormal discharge during sputtering.

Others

In the present invention, there is no particular limitation on angle $\theta_1$ that can be formed by the first region A and the second region B (hereinafter sometimes referred to as "inclination angle $\theta_1$") if the angle $\theta_1$ is smaller than a vertical angle ($\theta_1=90°$) (more specifically, see the angle $\theta_1$ shown in FIG. 15). The lower limit of the inclination angle $\theta_1$ is preferably 1° or more, more preferably 1.5° or more, still more preferably 2° or more, and particularly preferably 5° or more, and the upper limit of the inclination angle $\theta_1$ is preferably 70° or less, more preferably 50° or less, still more preferably 30° or less, and particularly preferably 10° or less. Specifically, the inclination angle $\theta_1$ is in a range of $1°\leq\theta_1\leq70°$, preferably $1.5°\leq\theta_1\leq50°$, more preferably $2°\leq\theta_1\leq30°$, and still more preferably $50°\leq\theta_1\leq10°$.

There is no particular limitation on angle $\theta_2$ that can be formed by the second region B and the third region C (hereinafter sometimes referred to as "inclination angle $\theta_2$") as long as the angle $\theta_2$ is smaller than a vertical angle ($\theta_2=90°$) (more specifically, see the angle $\theta_2$ shown in FIG. 15). The lower limit of the inclination angle $\theta_2$ is preferably 1° or more, more preferably 5° or more, still more preferably 10° or more, and particularly preferably 15° or more, and the upper limit of the inclination angle $\theta_2$ is preferably 70° or less, more preferably 50° or less, still more preferably 30° or less, and particularly preferably 25° or less. More specifically, the inclination angle $\theta_2$ is in a range of $1°\leq\theta_2\leq70°$, preferably $5°\leq\theta_2\leq50°$, more preferably $10°\leq\theta_2\leq30°$, and still more preferably, $15\leq\theta_2\leq25°$.

When the inclination angles $\theta_1$, $\theta_2$ each is in the above range, the film thickness uniformity of a thin film that can be formed on the substrate is improved during sputtering, and abnormal discharge that can be generated at such corners can be suppressed.

Supporting Member

Figure 12:
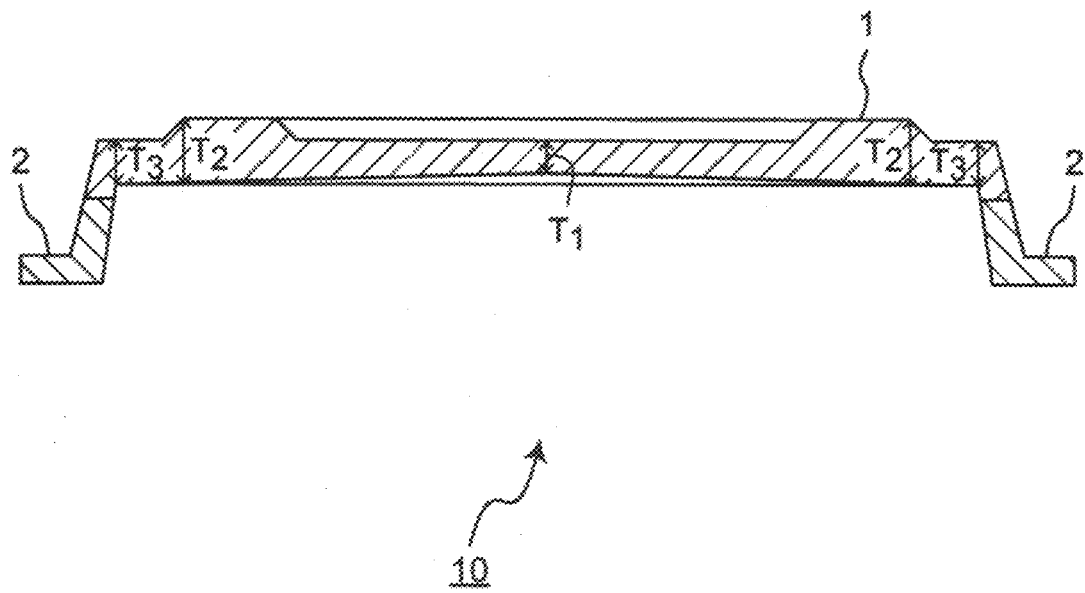
FIG. 12 is a schematic cross-sectional view illustrating a sputtering target of an embodiment of the present invention.

As shown in FIG. 12, the sputtering target 10 may include a supporting member 2 to fix the sputtering target 10 to a sputtering apparatus such as a magnetron sputtering apparatus.

The supporting member 2 is made of metal and can be made from a material selected from the group consisting of metals such as aluminum, copper, iron, chromium, nickel, and alloys thereof.

The supporting member 2 is mainly composed of a ring for receiving the target material 1 and may further comprise a flange capable of fixing the supporting member 2 to the sputtering device. Preferably, the ring and the flange of the supporting member 2 are integrally formed from the above materials by cutting.

There is no particular limitation on thickness (i.e., wall thickness) of the ring. The thickness is, for example, 5 mm to 20 mm, and preferably 10 mm to 15 mm. The thickness of the ring may be or may not be uniform. For example, as shown in FIG. 12, the ring may be formed in a manner that its thickness increases as it gets close to the flange.

As is described in detail below, the target material 1 is preferably bonded to the ring of the supporting member 2 by welding such as electron beam (EB) welding, or by joint via a soldering material which will be described in detail below. Preferably, the outer periphery of the ring of the supporting member 2 is formed flush with the outer periphery of the target material 1. The outer periphery of the target material 1 and the supporting member 2 may be tapered, as shown in FIG. 12.

The flange of the supporting member 2 may be formed with a plurality of holes which allows the supporting member 2 to fix to the sputtering apparatus via fasteners such as bolts.

There is no particular limitation on thickness of the flange. The thickness is, for example, 5 mm to 15 mm, preferably 8 mm to 12 mm, and more preferably 10 mm to 11 mm. Further, it is preferred that the thickness of the flange is uniform.

There is no particular limitation on height of the supporting member 2. The height is, for example, 10 mm to 30 mm, preferably 20 mm to 29 mm, and more preferably 25 mm to 29 mm.

There is no particular limitation on entire height (i.e., distance from the top face of the second region B of the target material 1 to a reverse face of the flange of the supporting member 2) of the sputtering target 10. The height is, for example, 10 mm to 70 mm, preferably 13 mm to 65 mm, and more preferably 15 mm to 60 mm.

Figure 13:
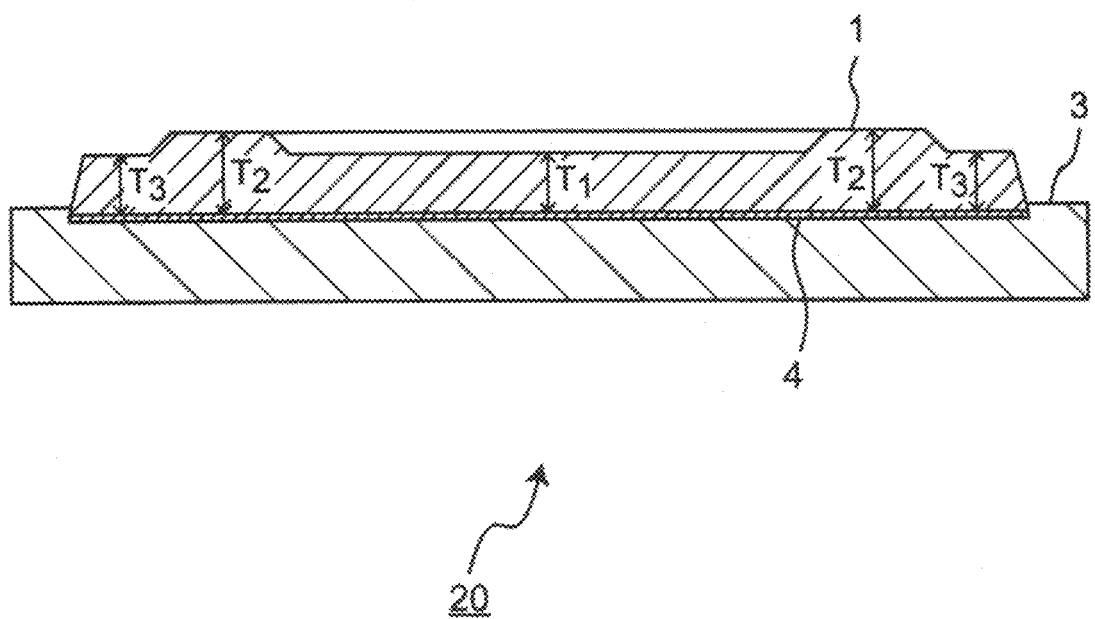
FIG. 13 is a schematic cross-sectional view illustrating a sputtering target of an embodiment of the present invention.

In the embodiment shown in FIG. 13, the sputtering target 20 may include, for example, a backing plate 3 which allows the sputtering target 20 to fix to a sputtering apparatus such as a magnetron sputtering apparatus and which can dissipate heat from the target material 1.

There is no particular limitation on backing plate 3 as long as it is made of a conductive material. Preferred is the baking plate 3 made of a material such as metal or alloy thereof.

Examples of the metal and the alloy thereof include copper, copper alloy, aluminum, aluminum alloy, titanium, titanium alloy, tungsten, tungsten alloy, molybdenum, molybdenum alloy, tantalum, tantalum alloy, niobium, niobium alloy, stainless steel, and the like. From the viewpoint of workability, mechanical strength, durability, heat dissipation, and the like, it is preferred to use copper. Among them, from the viewpoint of high heat conductivity and high electrical conductivity, it is preferred to use oxygen-free copper (having a purity of 99.96% or more and oxygen concentration of 10 ppm or less). There is also no particular limitation on size and shape of the backing plate 3.

As shown in FIG. 13, by using a soldering material 4, the target material 1 can be joined to the backing plate 3.

There is no particular limitation on soldering material 4. The soldering material 4 is a material containing metal or alloy having a low melting point (e.g., 723 K or lower). The material is made of metal selected from the group consisting of, for example, indium (In), tin (Sn), zinc (Zn), lead (Pb), silver (Ag), copper (Cu), bismuth (Bi), cadmium (Cd), and antimony (Sb), and alloys thereof. More specifically, examples thereof include In, In—Sn, Sn—Pb, Sn—Zn, Sn—Zn—In, In—Ag, Sn—Pb—Ag, Sn—Bi, Sn—Ag—Cu, Pb—Ag, Zn—Cd, Pb—Sn—Sb, Pb—Sn—Cd, Pb—Sn—In, Bi—Sn—Sb, and the like.

The backing plate 3 may be formed with a plurality of holes to allow the backing plate 3 to fix to a sputtering apparatus via fasteners such as bolts.

There is no particular limitation on thickness of the backing plate 3. The thickness is, for example, 5 mm to 30 mm, preferably 7 mm to 29 mm, and more preferably 10 mm to 25 mm.

There is no particular limitation on entire height of the sputtering target 20 (i.e., distance from the top face of the second region B of the target material 1 to the reverse face of the baking plate 3). The height is, for example, 10 mm to 70 mm, preferably 13 mm to 65 mm, and more preferably 15 mm to 60 mm.

Method for Manufacturing Sputtering Target

According to the method for manufacturing a sputtering target of the present invention, for example, first, materials of a target materials are mixed and melted, followed by casting to form an ingot called a slab. The ingot is subjected to rolling and a heat treatment, followed by cutting into an optional shape with optional size, for example, a disc shape to obtain a preliminary formed body of the target material.

After the preliminary formed body of the target material and a preliminary manufactured supporting member or backing plate are welded or joined via a soldering material or the like, the preliminary formed body of the target material is formed into a desired shape by cutting to produce a sputtering target. In the case of joint using a soldering material, the preliminary formed body of the target material and the supporting member or the backing plate can be joined using the above soldering material at a temperature in a range of 205° C. to 240° C. by vacuum joining.

In the embodiment shown in FIG. 12, the reverse face of the target material may be subjected to cutting across a joining surface between the target material and the supporting member by cutting. By cutting, a conical recess with a center of circle being a top may be formed. The depth to the top of such recess is usually 1 mm to 3 mm. When the reverse face of the target material has the above recess, the thickness ($T_1$) of the first region A is a distance between the top face of the region A and a bottom face of the region A of which thickness is minimum (i.e., distance between the top face of the region A and the top of the recess). The thickness ($T_2$) of the second region B is a distance between the top face of the region B and the bottom face of the region B of which thickness is maximum. The thickness ($T_3$) of the third region C is a distance between the top face of the region C and the bottom face of the region C of which thickness is maximum (except for a joint part between the target material and the supporting member).

In the present invention, the method for manufacturing a sputtering target is not limited to the above method.

Sputtering Apparatus

There is no particular limitation on sputtering apparatus, and commercially available sputtering apparatuses can be used without limitation.

Among them, it is preferred to use a magnetron sputtering apparatus. In the magnetron sputtering apparatus, an inert gas made into plasma (or being ionized), e.g., argon, can be captured by using magnet, so that target atoms can be effectively sputtered from the target material, thus making it possible to increase a deposition rate of film onto the substrate.

As a magnetron sputtering apparatus, an apparatus "ceraus Z-1000" manufactured by ULVAC, Inc is preferred, and an apparatus employing an electromagnet type magnet is particularly preferred. Alternatively, an apparatus "Endura" manufactured by Applied Materials, Inc. may be used. Among them, an apparatus using a Dura-type magnet is preferred.

Substrate

There is no particular limitation on substrate in as long as a thin film can be formed by using the above sputtering target and sputtering device. Examples of the substrate include a metal wafer made of silicon, copper, or the like, an oxide wafer made of zinc oxide, magnesium oxide, a glass substrate made of quartz, pyrex, and a resin substrate.

There is no particular limitation on shape of the substrate, and circle is preferred. Further, there is no particular limitation on size of the substrate, and the size is, for example, 100 mm to 450 mm, preferably 150 mm to 300 mm, and more preferably 200 mm.

Life Time of Sputtering Target

The sputtering target of the present invention can have a life time at the integral power of 650 kWh to 750 kWh or more. The life time as used herein is a threshold having film thickness uniformity, e.g., integral power consumption by which sputtering can be performed without excessing 6.4%.

In the present invention, such life time can be obtained as a result that the sputtering target of the present invention comprises the target material having the above shape and size.

Among them, particularly such life time can be obtained because the sputtering face of the target material comprises the first region A, the second region B, and the third region C, and the diameter ($W_1$) of the first region A is 14% or more and less than 60% of the diameter ($R_f$) of the sputtering face, and the inner diameter (r) of the third region is less than 90% of the diameter of the sputtering face.

Film Thickness Uniformity of Thin Film to be Formed on Substrate

The film thickness uniformity of a thin film that can be formed on the substrate by the sputtering target of the present invention can be calculated from the formula: (max−min)/(max+min)×100(%) based on the maximum value (max) and the minimum value (min) of a value of a film thickness t (μm) calculated by the formula: $t=R_V/R_S \times 10^6$ according to sheet resistance $R_S$ (Ω/□) measured at the predetermined nine points on the thin film that can be formed on the substrate and known volume resistivity $R_V$ (Ω·m) of the thin film. In the case of an aluminum thin film, $R_V=2.9 \times 10^{-8}$ (Ω·m).

Figure 14:
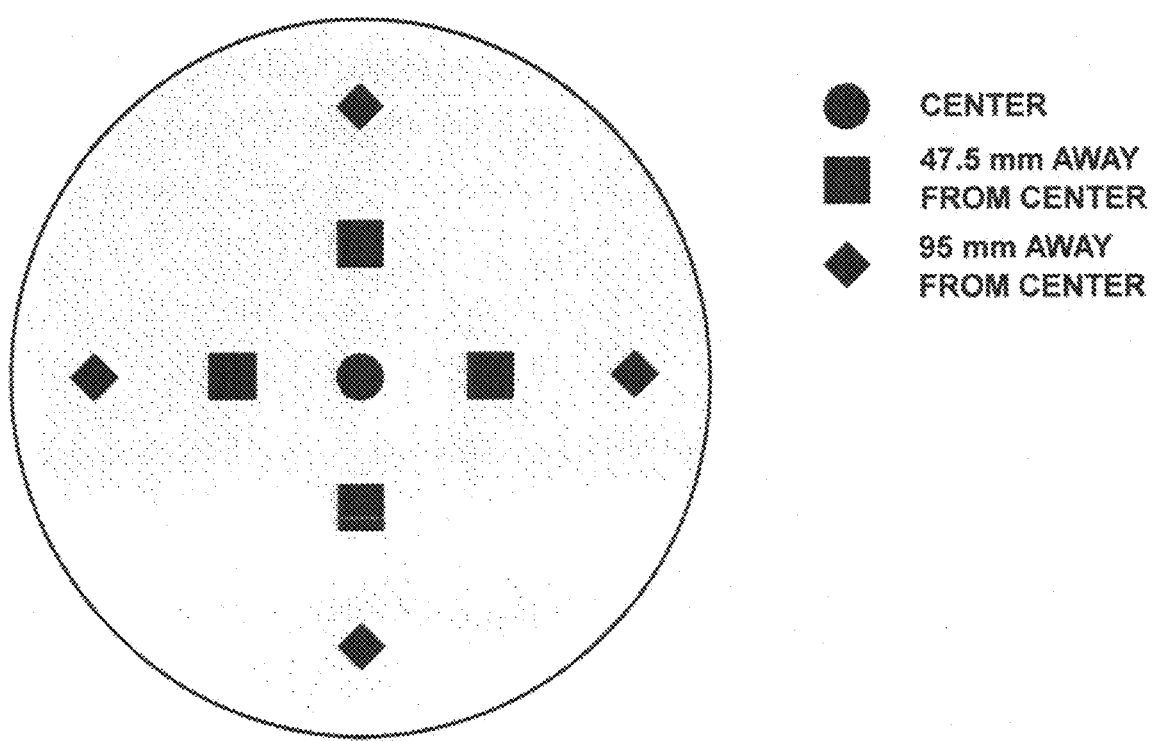
FIG. 14 is a schematic diagram showing measurement points (points 1 to 9) for measuring sheet resistance (Ω/□) at nine points in a thin film on a substrate having a diameter of 200 mm.

The sheet resistance (Ω/□) of the thin film can be measured by using, for example, Omnimap RS35c manufactured by KLA-Tencor Corporation. The predetermined nine points where measurement is to be performed, for example, when the substrate having a diameter of 200 mm is used, for example, as shown in FIG. 14, are a center and positions 47.5 mm away from the center (middle parts) and positions 95 mm away from the center (end parts) existing along each of an X axis and a Y axis (total 9 points).

In the present invention, the film thickness uniformity is, for example, less than 6.4%, preferably less than 6.3%, and more preferably less than 6.0%. At the initial stage of sputtering (e.g., 0 and 200 kWh), the film thickness uniformity may be less than 6.4%, preferably less than 6.3%, and more preferably less than 6.0%. At the final stage (particularly at the time after a long time of 750 kWh or more has passed), the film thickness uniformity may still be less than 6.4%, preferably less than 6.3%, and more preferably less than 6.0%.

As mentioned above, in the present invention, excellent film thickness uniformity can be obtained at the initial stage and the final stage, particularly at the final stage, of sputtering.

In the following Examples, the present invention will be described in detail, but the present invention is not limited to the following Examples.

EXAMPLES

Example 1

An ingot (slab) was obtained by adding 0.5% by weight of copper to aluminum having a purity of 99.999% and melting the mixture, and casting the melt. The ingot was subjected to rolling and a heat treatment, followed by cutting into a disc shape using a milling machine to obtain a preliminary formed body of a target material having a diameter of 325 mm to a thickness of 18 mm.

Such a preliminary formed body of the target material and the backing plate having a shape shown in FIG. 13 were joined together using a soldering material (In) at a temperature of 200° C. Furthermore, the preliminary formed body of the target material was formed into a shape shown in FIG. 15 by cutting with a lathe to produce a sputtering target. Each size of the target material is as mentioned below. Each symbol represents the corresponding region shown in FIG. 15.

Figure 18:
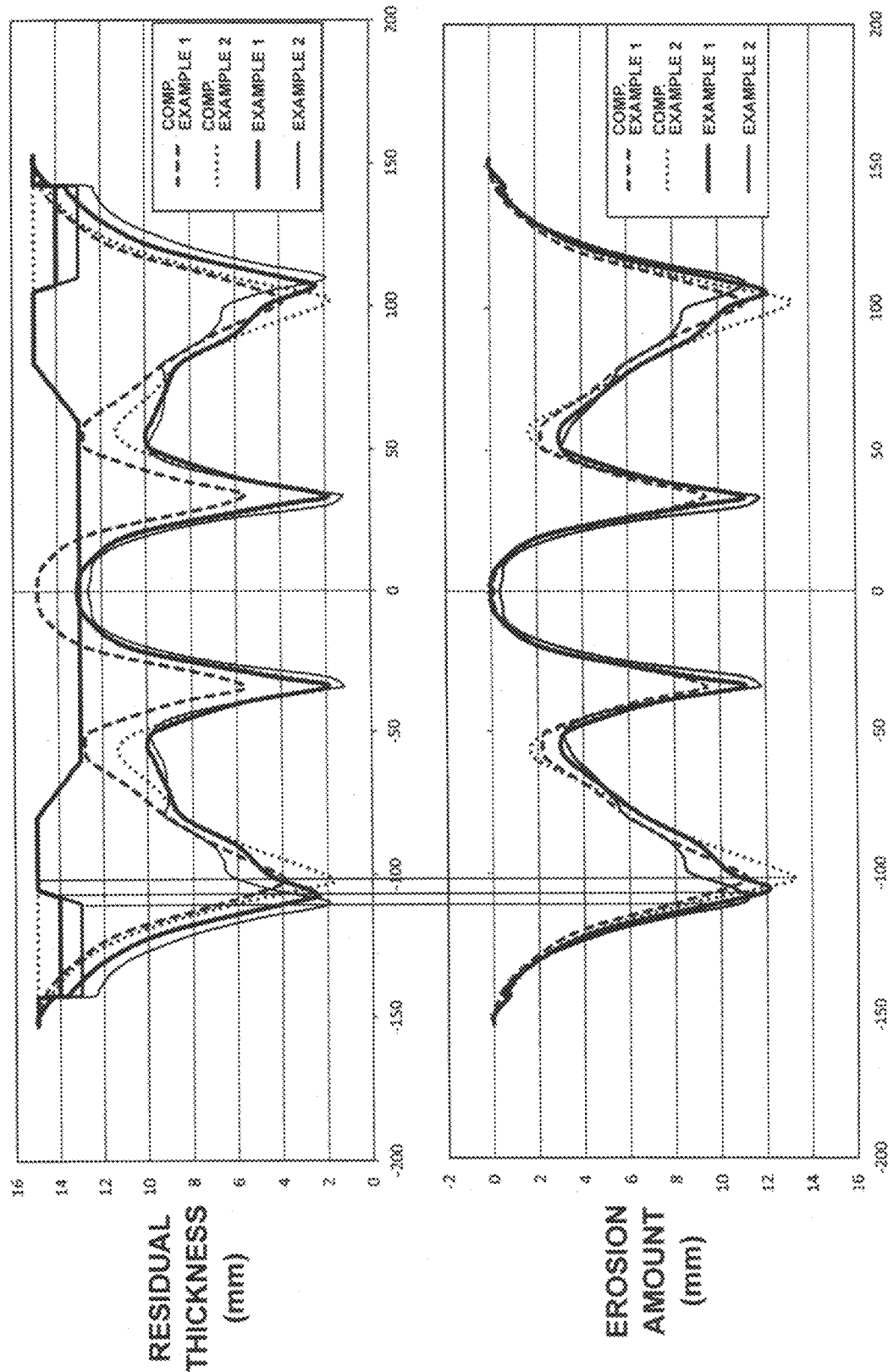
FIG. 18 is a graph showing a residual thickness and an erosion amount at a position on a sputtering face.

The target material of the sputtering target according to Example 1 had a "ramp ($W_{2c}$)" at a position where erosion concentrates most intensively as shown in FIG. 15 and FIG. 18.

$R_f$: 312 mm
r: 215 mm
$T_1$: 13 mm
$T_2$: 15 mm
$T_3$: 14 mm
$T_4$: 15 mm
$T_x$: 12 mm
$\theta_1$: 5.70
$\theta_2$: 21.80
$W_1$: 120 mm
$W_2$: 25 mm
$W_{2a}$: 20 mm
$W_{2c}$: 2.5 mm
$W_3$: 35 mm
$W_4$: 10 mm
$W_{4c}$: 0.5 mm
$W_x$: 3 mm
$W_1/R_f \times 100 = 38.5\%$
$r/R_f \times 100 = 68.9\%$
$T_3/W_3 = 0.4$ Height of the entire sputtering target (distance from the top face of the second region to the reverse face of the backing plate): 27.3 mm Example 2

In the same manner as in Example 1, a sputtering target of the Example 2 was produced. Each size of the target material is as mentioned below. Each symbol represents the corresponding region as shown in FIG. 15. The target material of the sputtering target of Example 2 was a "ramp ($W_{2c}$)" at a position where erosion concentrates most intensively as shown in FIG. 15 and FIG. 18.

$R_f$: 312 mm
r: 220 mm
$T_1$: 13 mm
$T_2$: 15 mm
$T_3$: 13 mm
$T_4$: 15 mm $T_x$: 12 mm
$\theta_1$: 5.7°
$\theta_2$: 21.8°
$W_1$: 120 mm
$W_2$: 25 mm
$W_{2a}$: 20 mm
$W_{2c}$: 5 mm
$W_3$: 32.5 mm
$W_4$: 10 mm
$W_{4c}$: 0.5 mm
$W_x$: 3 mm
$W_1/R_f \times 100 = 38.5\%$
$r/R_f \times 100 = 70.5\%$
$T_3/W_3 = 0.4$
Height of the entire sputtering target (distance from the top face of the second region to the reverse face of the backing plate): 27.3 mm Comparative Example 1

In the same manner as in Example 1, a sputtering target of Comparative Example 1 was produced. Each size of the target material is as mentioned below. The target material of the sputtering target of Comparative Example 1 had a ramp only in a region of X (standard shape).
$R_{cf}$: 312 mm
$r_c$: 306 mm
$T_1$: 15 mm
$T_{cx}$: 12 mm
$W_{cx}$: 3 mm
Height of the entire sputtering target (distance from the top face of the second region to the reverse face of the backing plate): 27.3 mm Comparative Example 2

Figure 17:
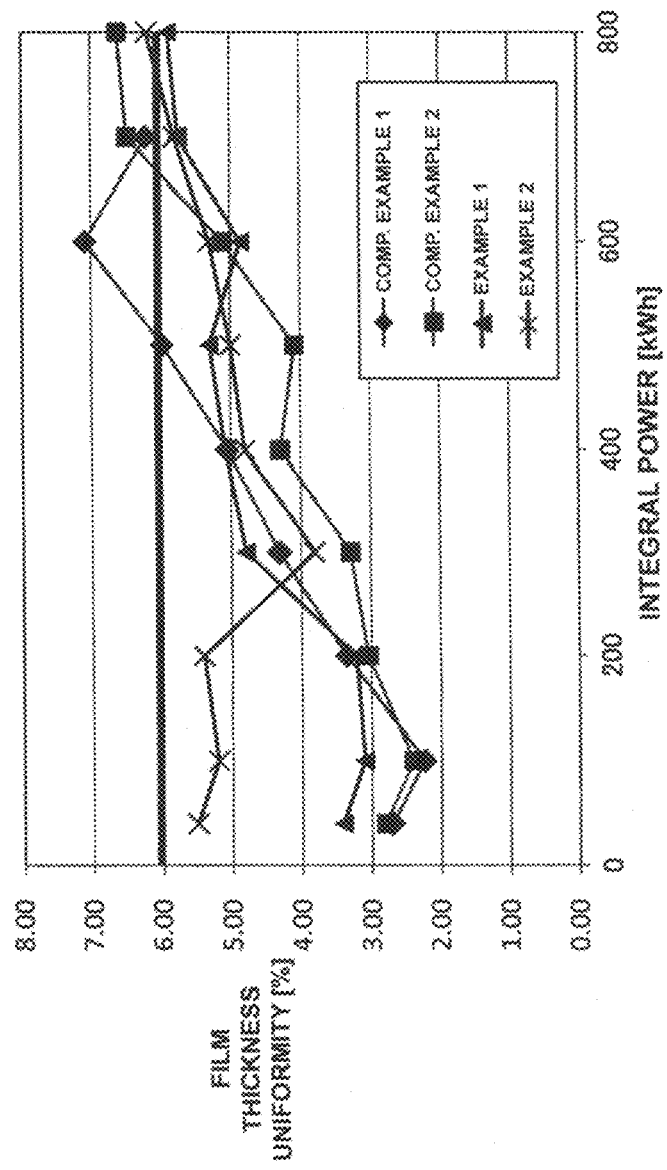
FIG. 17 is a graph showing a relation between integral power consumption and film thickness uniformity.

In the same manner as in Example 1, a sputtering target of the Comparative Example 2 was produced. Each size of the target material is as mentioned below. The target material of the sputtering target of Comparative Example 2 had no "ramp" at a position where erosion concentrates most intensively.
$R_{cf}$: 312 mm
$r_c$: 306 mm
$T_{c1}$: 13 mm
$T_{c2}$: 15 mm
$T_{cx}$: 12 mm
$\theta_{c1}$: 5.7°
$W_{c1}$: 120 mm
$W_{c2}$: 73 mm
$W_{c2a}$: 20 mm
$W_{cx}$: 3 mm
$W_{c1}/R_{cf} \times 100 = 38.5\%$
Height of the entire sputtering target (distance from the top face of the second region to the reverse face of the backing plate): 27.3 mm
Sputtering
Using a magnetron sputtering apparatus (ceraus Z-1000 manufactured by ULVAC, Inc., magnet: electromagnet type) and the sputtering targets of Examples and Comparative Examples, a thin film was formed on a substrate having a diameter of 200 mm (silicon substrate manufactured by LG Siltron, Inc.) under the following conditions.
<Sputtering Conditions>
Output: 10 kW
Inert gas: argon
Substrate temperature: 25° C.
Distance between target and substrate (TS distance): 40 mm
Evaluation of Sputtering Target
A sputtering operation was performed with respect to each sputtering target of Examples and Comparative Examples under the above conditions over a range of 0 to 800 kWh. A relation between the integral power consumption (kWh) and the film thickness uniformity (%) is shown in FIG. 17. A residual thickness and an erosion amount at a position of the sputtering face (at 700 kWh in Comparative Example 1, or 800 kWh in Comparative Example 2, Example 1, and Example 2) is shown in FIG. 18.

As shown from FIG. 17, in the sputtering targets of Example 1 and Example 2, the film thickness uniformity can be maintained at less than 6% at the initial stage and the final stage, particularly at the final stage, of sputtering at an integral power consumption of 650 kWh to 750 kWh, and the target material was be able to use during a period longer than that of the conventional target materials.

Whereas, the film thickness uniformity was degraded beyond 6% when the integral power consumption exceeds 500 kWh in Comparative Example 1 or the integral power consumption exceeds 650 kWh in Comparative Example 2.

These results may be caused by the existence of a ramp provided to reduce the thickness of the target material at a position where erosion intensively concentrates in Examples 1 and 2. It is considered that, because of the existence of such a ramp, the erosion region moves (shifts) to the edge side of the target material, thus decreasing a difference in thickness generated at the middle part, the end part, and the center of the substrate, leading to an improvement in film thickness uniformity at the final stage (FIG. 7 to FIG. 9, and FIG. 18).

INDUSTRIAL APPLICABILITY

The sputtering target of the present invention can be employed in commercially available sputtering apparatus, particularly a magnetron sputtering apparatus, and a thin film having excellent film thickness uniformity can be formed on a substrate during sputtering, particularly at the final stage of sputtering. This is highly effective in formation of a thin film by sputtering.

DESCRIPTION OF REFERENCE NUMERALS

1 Target material
2 Supporting member
3 Backing plate
4 Soldering material
10 Sputtering target
20 Sputtering target
A First region
B Second region
C Third region
O Center of sputtering face

The invention claimed is:
1. A sputtering target comprising a target material, wherein a sputtering face of the target material has a ramp provided, to reduce a thickness of the target material, at a region at a position of 80% or more depth against the deepest position of an erosion to be generated during sputtering, wherein the thickness of the ramp is 0.3 mm to 10 mm.
2. The sputtering target according to claim 1, wherein the sputtering face has a circular shape, and the ramp is formed at a position in a range of 60% or more and less than 90% of a diameter of the sputtering face so as to reduce the thickness of the target material toward a peripheral part of the sputtering face in the radical direction of the sputtering face.

3. The sputtering target according to claim 2, wherein the target material includes a flat circular first region positioned at a center of the sputtering face, a flat ring-shaped second region positioned around the first region, and a flat ring-shaped third region positioned around the second region, wherein the ramp exists between the second region and the third region, and a thickness of the third region is smaller than a thickness of the second region;

wherein the thickness of the third region is equal to or larger than a thickness of the first region and a diameter of the first region accounts for 14% or more and less than 60% of the diameter of the sputtering face; and wherein an inner diameter of the third region accounts for less than 90% of the diameter of the sputtering face.

4. The sputtering target according to claim 3, wherein a ratio of the thickness of the third region to a ring width of the third region is in a range of 0.1 to 1.1.

5. The sputtering target according to claim 4, wherein the ratio is in a range of 0.1 to 0.6.

* * * * *